US006097649A

United States Patent [19]
Chiang et al.

[11] Patent Number: 6,097,649
[45] Date of Patent: Aug. 1, 2000

[54] METHOD AND STRUCTURE FOR REFRESH OPERATION WITH A LOW VOLTAGE OF LOGIC HIGH IN A MEMORY DEVICE

[75] Inventors: Paul M-Bhor Chiang, Cupertino; Jin-Man Han; Hung-Mao Lin, both of San Jose, all of Calif.

[73] Assignee: Silicon Magic Corporation, Santa Clara, Calif.

[21] Appl. No.: 09/088,426

[22] Filed: Jun. 1, 1998

[51] Int. Cl.[7] .................................................. G11C 7/00
[52] U.S. Cl. ........................................ 365/203; 365/222
[58] Field of Search .................................... 365/203, 149, 365/222, 207

[56] References Cited

U.S. PATENT DOCUMENTS

| | | | |
|---|---|---|---|
| 5,339,274 | 8/1994 | Dhong et al. | 365/203 |
| 5,844,832 | 12/1998 | Kim | 365/145 |
| 5,892,728 | 4/1999 | Allen et al. | 365/230.06 |

*Primary Examiner*—David Nelms
*Assistant Examiner*—Anh Phung
*Attorney, Agent, or Firm*—Sawyer & Associates

[57] ABSTRACT

A method and structure for a refresh operation with a low voltage of logic high in a computer memory structure is provided. The method and system includes first the precharging of a plurality of bit lines and a plurality of complementary bit lines to a voltage higher than the reference voltage. Then at least one of a plurality of word lines and at least one of a plurality of reference word lines are selected. Next, the sense amplifier is activated such that either the plurality of bit lines or the plurality of complementary bit lines discharges to a voltage of logic low. This discharge creates a voltage difference between the plurality of bit lines and the plurality of complementary bit lines. The resulting voltage on the bit lines is restored to the memory cells on the selected word lines. Then, the plurality of bit lines and the plurality of complementary bit lines are restored to the reference voltage. This method and structure allows the use of a logic high voltage lower than 2.0 V without compromising the reliability of the sense amplifier. The implementation of the method and structure of the present invention is cost effective and practical for most if not all DRAM applications.

13 Claims, 9 Drawing Sheets

METHOD AND STRUCTURE FOR REFRESH OPERATION WITH A LOW VOLTAGE OF LOGIC HIGH IN A MEMORY DEVICE

FIELD OF THE INVENTION

The present invention relates to semiconductor memory devices and more particularly to lowering of the voltage of logic high in the refresh operation with a low voltage of logic high of a Dynamic Random Access Memory (DRAM) device without compromising the reliability of the device's operation.

BACKGROUND OF THE INVENTION

Dynamic Random Access Memories (DRAMs) are used in a variety of applications. It is a very popular memory technology because of its high density and consequent low price. FIG. 1 shows a simplified structure of a DRAM chip 100. The chip 100 comprises a plurality of memory cells 102. Each memory cell comprises a storage capacitor 102a and an access transistor 102b. One memory bit is stored in each memory cell 102. The value of the memory bit is represented by voltage stored in the storage capacitor 102a. A logic high is stored as a high voltage (Vdd), while logic low is stored as a low voltage (typically ground).

The memory cells 102 are arranged on the chip 100 in a grid of rows and columns. Each row is a word line 104a–104b, and each column is a bit line 106a–106b. A single memory cell can be selected by a row address and a column address. Row address decoders 108 and column address decoders 110 process their respective addresses such that the correct row and column is accessed to select a particular cell. The grid organization of memory cells and its row and column address decoders are well known in the art and will not be further discussed here. Sense amplifiers 114a and 114b detect the charges stored on cells 102 in its column 106a and 106b, respectively.

A feature of DRAM is the destructive nature of the readout procedure. For example, if Cell 112 is to be read. The cell's 112 word line 104a is selected. The charge from the storage capacitor 102a of cell 112 is then transferred to the sense amplifier 114b, which detects it as either a "1" (logic high) or a "0" (logic low) to provide the readout of the cell. This readout procedure is destructive, since it disturbs the information in the storage capacitor 102a. Thus, the read operation is followed by a subsequent sensing and writing operation to refresh the information back into the cell 112, using write-back circuitry.

This refresh operation involves utilizing the sense amplifier 114b to compare the charge from the storage capacitor 102a of cell 112 to a "reference voltage" stored on certain memory cells, called "reference cells" (not shown). If the charge from the storage capacitor 102a of cell 112 is higher than the reference voltage, then the sense amplifier 114b will interpret the charge as a "1" and restore a charge of Vdd to the storage capacitor 102a of cell 112. If the charge from the storage capacitor 102a of cell 112 is lower than the reference voltage, then the sense amplifier 114b will interpret the charge as a "0" and restore a ground to the storage capacitor 102a of cell 112.

A problem of great concern is the gradual leakage of charge from the storage capacitors causing memory cells of the DRAM to eventually lose their information. Due to the leakage current of the memory cells, charge will leak from a memory cell storing a "1", and a memory cell storing a "0" will collect charge. To preserve the information, the charge in the memory cells must be refreshed periodically to charge "1"s in the memory cells back to full Vdd and discharge "0"s in the memory cells back to ground. The refresh process is periodically performed by providing a read operation as explained above with the selection of each word line without the selection of a bit line.

FIGS. 2A–2B show a conventional reference cell structure 200 which had been widely used in the DRAM industry. FIG. 2A shows the circuitry of this structure 200 while FIG. 2B shows the timing diagram for this circuitry. In this structure, each memory cell 210 (comprising a storage capacitor 210a and an access transistor 210b) is attached to a wordline 214, a bit line 202, and a complementary bit line 204. For this cell structure, both the bit line 202 and the complementary bit line 204 were precharged to full Vdd before sensing by the sense amplifier 212 began. A reference voltage of one-half of Vdd was stored on the storage capacitor 206a of the reference cell 206 on the reference word line 208. The reference cell 206 also comprises access transistor 206b. A one-half Vdd was stored on storage capacitor 206a by making its area half of the area of the storage capacitor 210a. This was extremely difficult when the memory cell 210 became as small as they are in the current state of the art. Thus, the size of memory cells in current DRAM has become too small for this method to be practical. Also, this conventional method required an additional precharge device for the storage capacitor 206a of the reference cell 206 which caused design difficulties.

FIGS. 3A–3B show another conventional reference cell structure 300. FIG. 3A shows the circuitry for this structure 300 while FIG. 3B shows its timing diagram. This structure 300 solved one of the problems of the structure 200 in FIG. 2A. Storage capacitor 302a and access transistor 302b comprise the memory cell 302, on the word line 314 while storage capacitors 304a and 306a and access transistor 304b 306b comprise the reference cells 304 and 306. Here, the storage capacitors 302a, 304a and 306a have the same area. Thus, there was no need for an additional precharge device. This device precharged the bit line 308 and complementary bit line 310 to one-half Vdd. This structure too became problematic as memory cells became smaller because of the limitations of the sense amplifier 312, as explained in conjunction with FIGS. 4A–4B below.

FIGS. 4A–4B show a conventional DRAM sensing structure 400 which can be used with reference cell structure 300 of FIG. 3. FIG. 4A shows the circuitry for the sensing structure 400 while FIG. 4B shows the timing diagram for this circuit. In this device, the equalization device 402 precharges the bit line 404 and complementary bit line 406 to one-half Vdd before a word line 408 is selected for charge sharing. When a word line 408 is selected, charge is shared between the bit line 404 and the memory cell 418 on the word line 408. If the memory cell 418 contains a "1", then the bit line 404 rises to a voltage slightly higher than one-half Vdd. The bit line 404 charges up only slightly because its capacitance is much larger than the capacitance of the memory cell. If the cell contains a "0", then the bit line 404 will fall to a voltage slightly lower than one-half Vdd. The resulting bit line voltage is then transferred to the sense amplifiers 410, 412.

Two kinds of sense amplifiers are used for this structure 400: an NMOS sense amplifier (N-SA) 410 and a PMOS sense amplifier (P-SA) 412. Typically, the NMOS transistors 414a–414b in the N-SA 410 are turned on first due to its high current drivability and its lower threshold voltage than the PMOS transistors 416a–416b in the P-SA 412.

The N-SA 410 compares the bit line's 404 voltage with the complementary bit line's 406 voltage after charge sharing. If the bit line 404 voltage is higher than the complementary bit line 406 voltage, the bottom NMOS transistor 414b of the N-SA 410 is activated, which in turn activates the PMOS transistor 416a, which then triggers a refresh of Vdd to the memory cell 418. If the bit line 404 voltage is lower than the complementary bit line 406 voltage, the NMOS transistor 414a of the N-SA 410 will be activated and will trigger a refresh of a ground voltage to the memory cell 418. Thus, the threshold voltage of the NMOS transistors 414 in the N-SA 410 is very important in the proper operation of DRAM.

Once a refresh operation is performed by the sense amplifiers N-SA 410 and P-SA 412, the equalization device 402 restores the bit line 404 and the complementary bit line 406 to one-half Vdd to wait for the next refresh cycle.

As memory cells become smaller so that more of them may be placed onto a single chip, the conventional sensing structure 400 becomes problematic. The need for a lower voltage operation of DRAMs is increasing every day. The Vdd for current DRAM is 3.3 V. Some memory devices that have memory density over 16 Megabits or 64 Megabits are now using voltage regulators to maintain Vdd as low as 2.2 V–2.4 V. If a Vdd below 2.0 V is used, the threshold voltage for the sense amplifier is set at less than 1.0 V. The bit lines would be precharged to less than 1.0 V. If the bit line shares charge with a memory cell storing Vdd, the resulting bit line voltage would be slightly above 1.0 V. The difference between the bit line voltage and the threshold voltage would only thus be approximately 0.1 V to 0.2 V. Although the NMOS transistors 414a–414b of N-SA 410 are suppose to be activated if the bit line voltage transferred to it is higher than the threshold voltage, due to physical limitations of the transistor devices, a small voltage difference, such as 0.1 V to 0.2 V, between the bit line voltage and the threshold voltage may not be properly detected by the transistors. Accordingly, the result is that the sense amplifiers may not be activated at the proper times. This seriously compromises the reliability of the sense amplifiers, and ultimately the operation of the DRAM. Techniques currently exist to manufacture semiconductors to operate successfully with a threshold voltage much lower than 1.0 V, however, the manufacturing process involved is very expensive and is impractical for most applications.

Thus, there is a need for a method and structure for a refresh operation in a memory device that has a Vdd that is 2.0 V or lower without compromising the reliability of the sense amplifiers. The manufacturing of the structure should be cost effective and practical. The present invention addresses such a need.

SUMMARY OF THE INVENTION

A method and structure for a refresh operation with a low voltage of logic high in a computer memory structure is provided. The method and system includes first precharging of a plurality of bit lines and a plurality of complementary bit lines to a voltage higher than the reference voltage. At least one of a plurality of word lines and at least one of a plurality of reference word lines are then selected. Next, either the plurality of bit lines or the plurality of complementary bit lines is discharged by the sense amplifier circuit to a voltage of logic low. This discharge creates a voltage difference between the plurality of bit lines and the plurality of complementary bit lines. The resulting voltage on the bit lines is restored to the memory cells on the selected word lines. Then, the plurality of bit lines and the plurality of complementary bit lines are restored to the reference volt-age. This method and structure allows the use of a logic high voltage lower than 2.0 V without compromising the reliability of the sense amplifier. The implementation of the method and structure of the present invention is cost effective and practical for most if not all DRAM applications.

BRIEF DESCRIPION OF THE DRAWINGS

FIG. 1 illustrates a simplified structure of a Dynamic Random Access Memory (DRAM) chip.

FIG. 2A illstrates a conventional reference cell structure.

Figure 1:
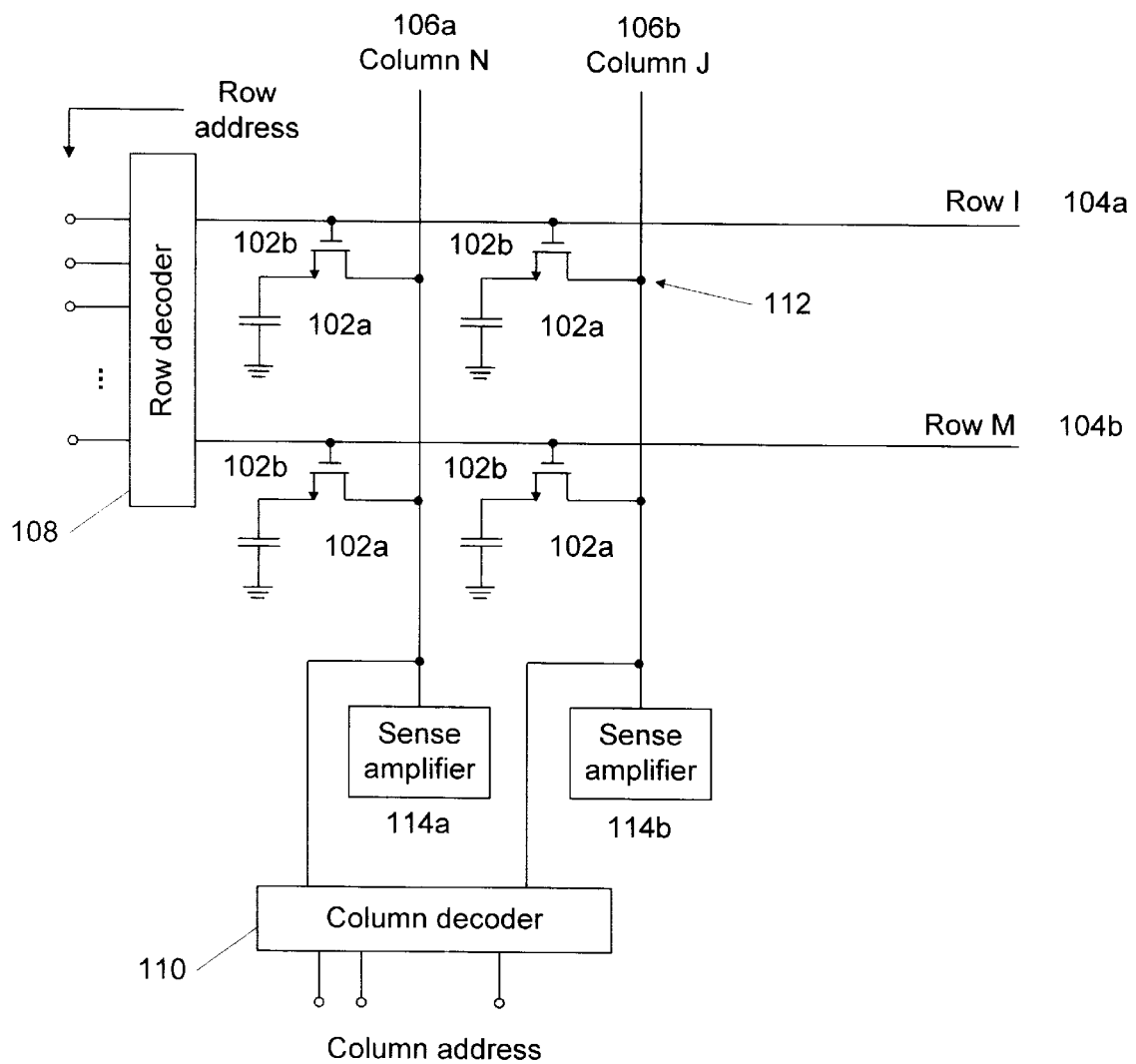
Figure 2A:
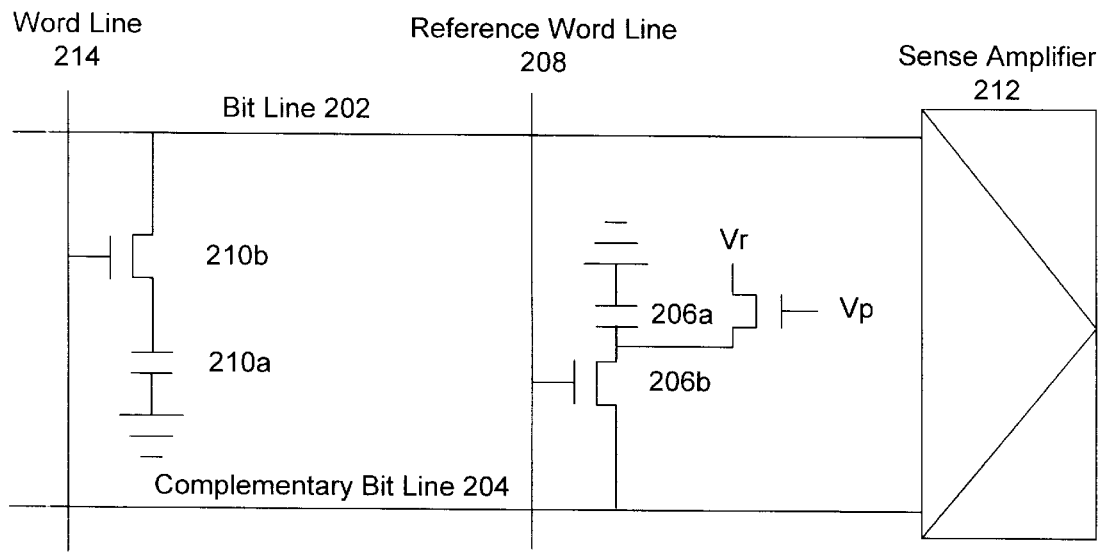
FIG. 2B illustrates a timing diagram for the conventional reference cell structure of FIG. 2A.
Figure 2B:
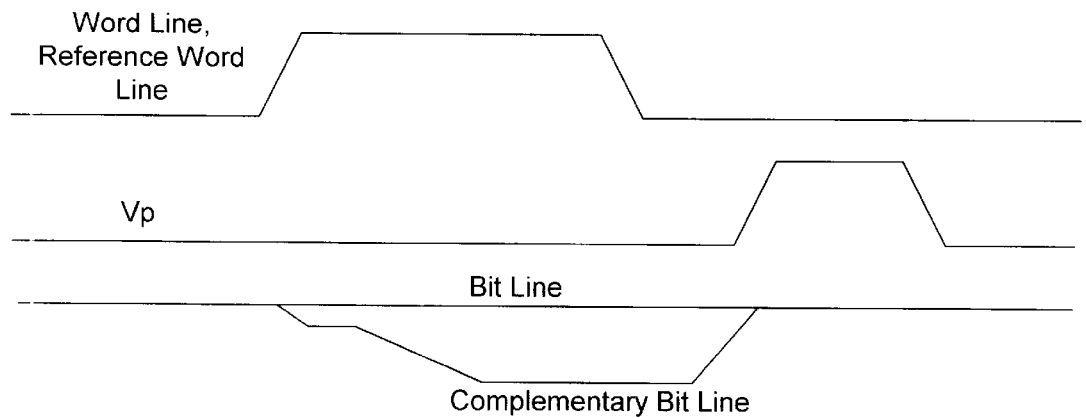
Figure 3A:
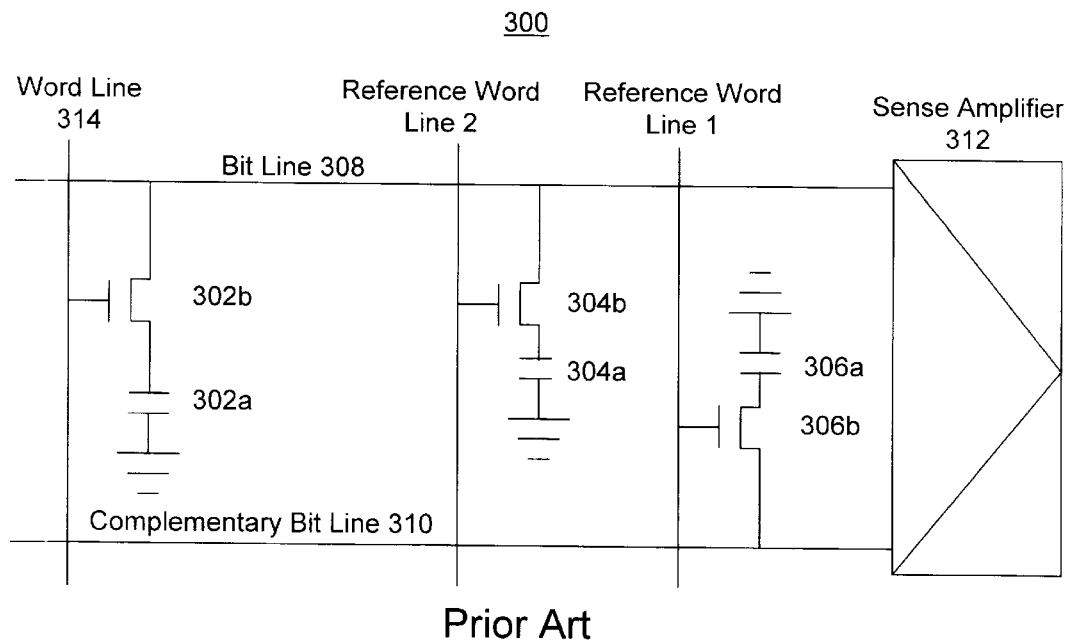
FIG. 3A illustrates another conventional reference cell structure.
Figure 3B:
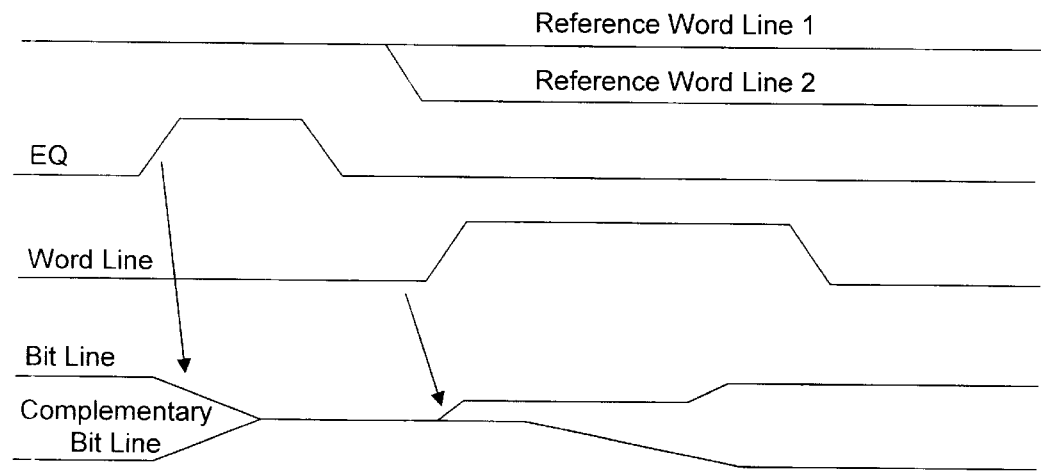
FIG. 3B illustrates a timing diagram for the conventional reference cell structure of FIG. 3B.
Figure 4A:
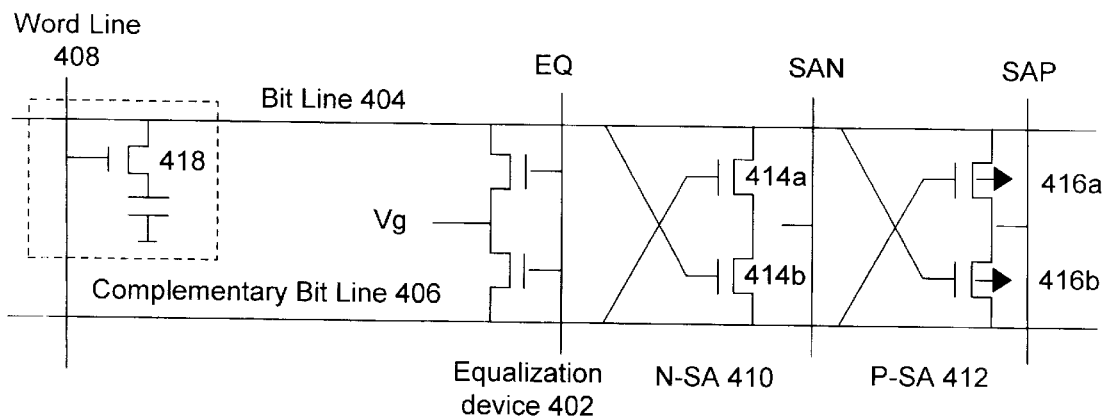

FIG. 4A illusates a conventional DRAM sensing structure.

Figure 4B:
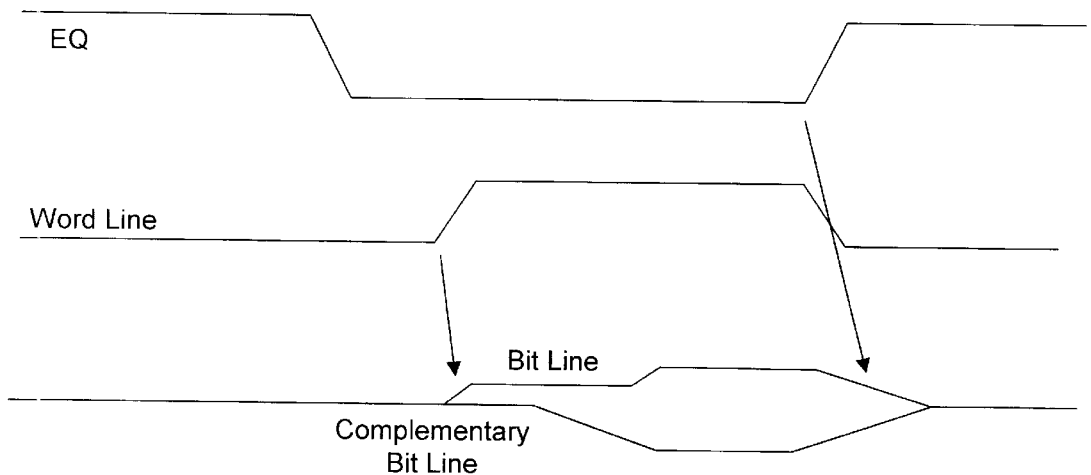

FIG. 4B illstrates a timing diagram for the conventional sensing structure of FIG. 4A.

Figure 5:
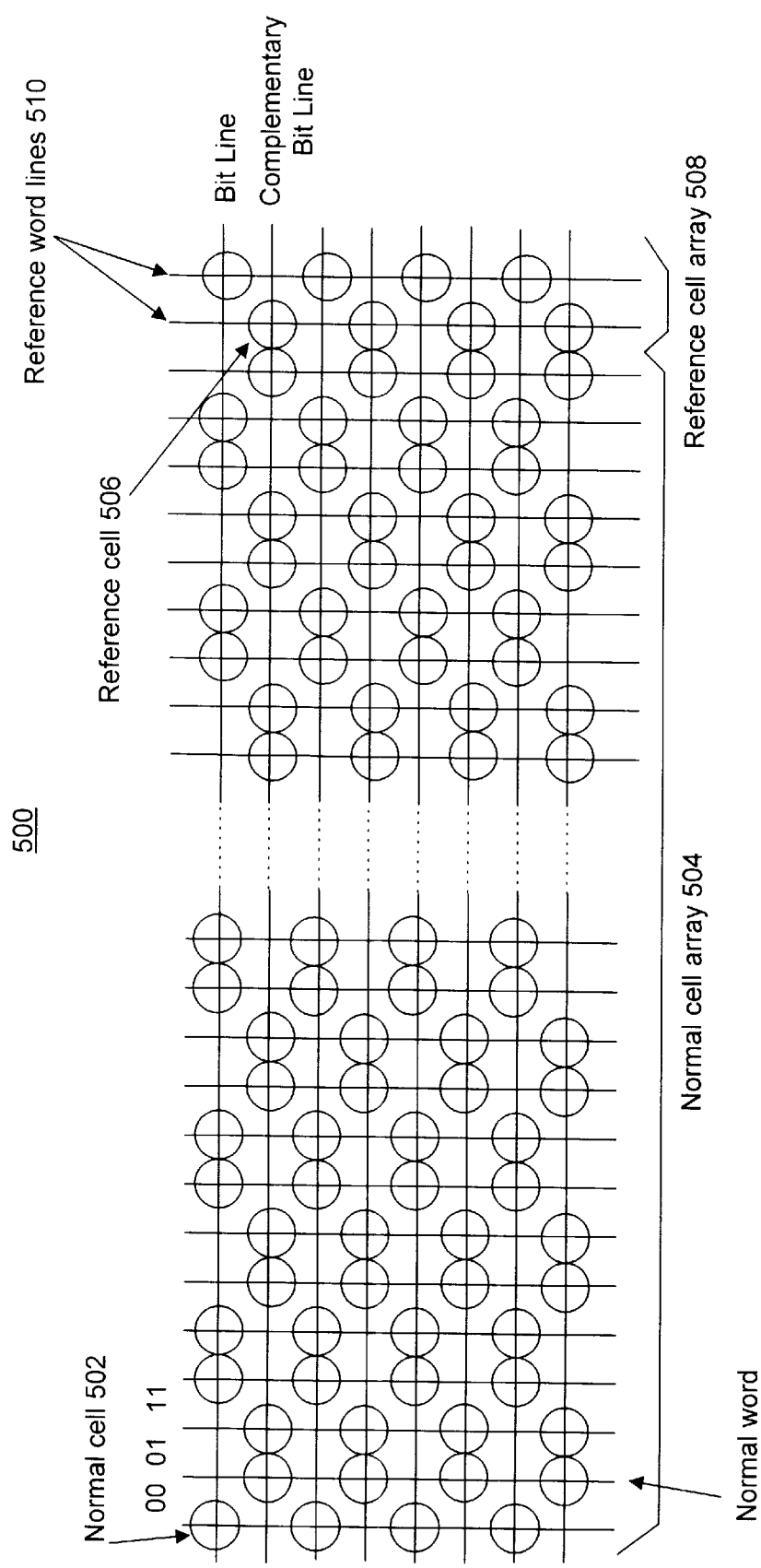

FIG. 5 illustrates a structure of a memory cell organization that can be utilized in a method in accordanoe with the present invention.

Figure 6:
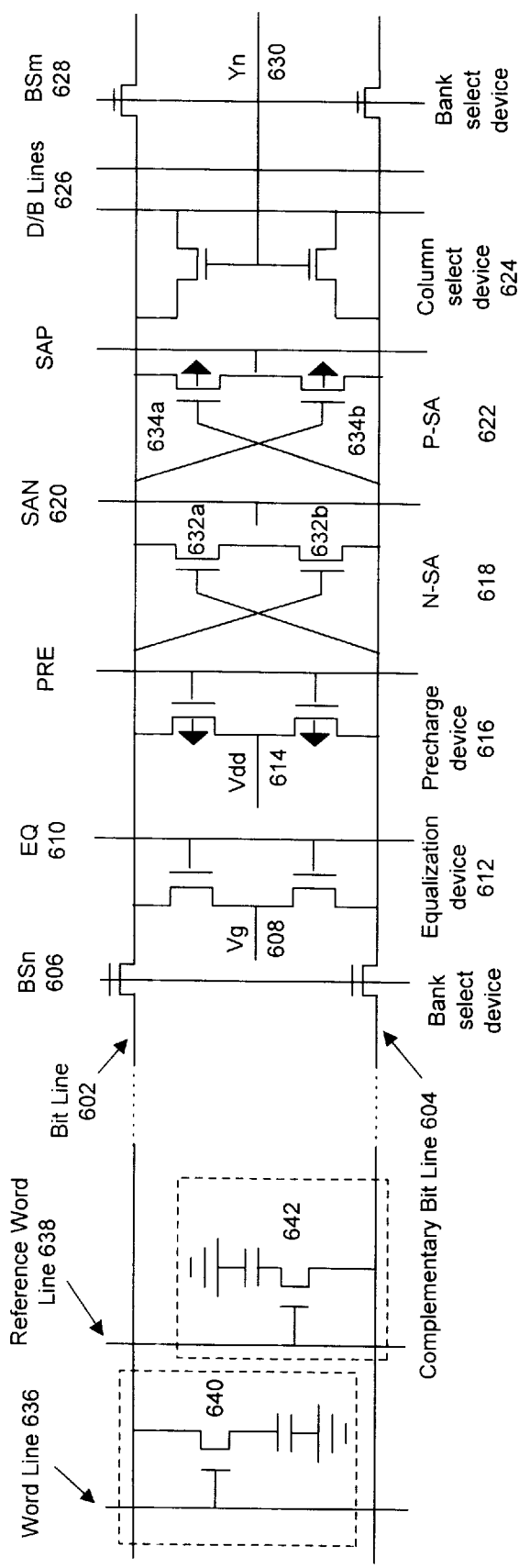

FIG. 6 illustrates a circuit of a preferred embodiment of a sensing circuitry in accordance with present invention.

Figure 7:
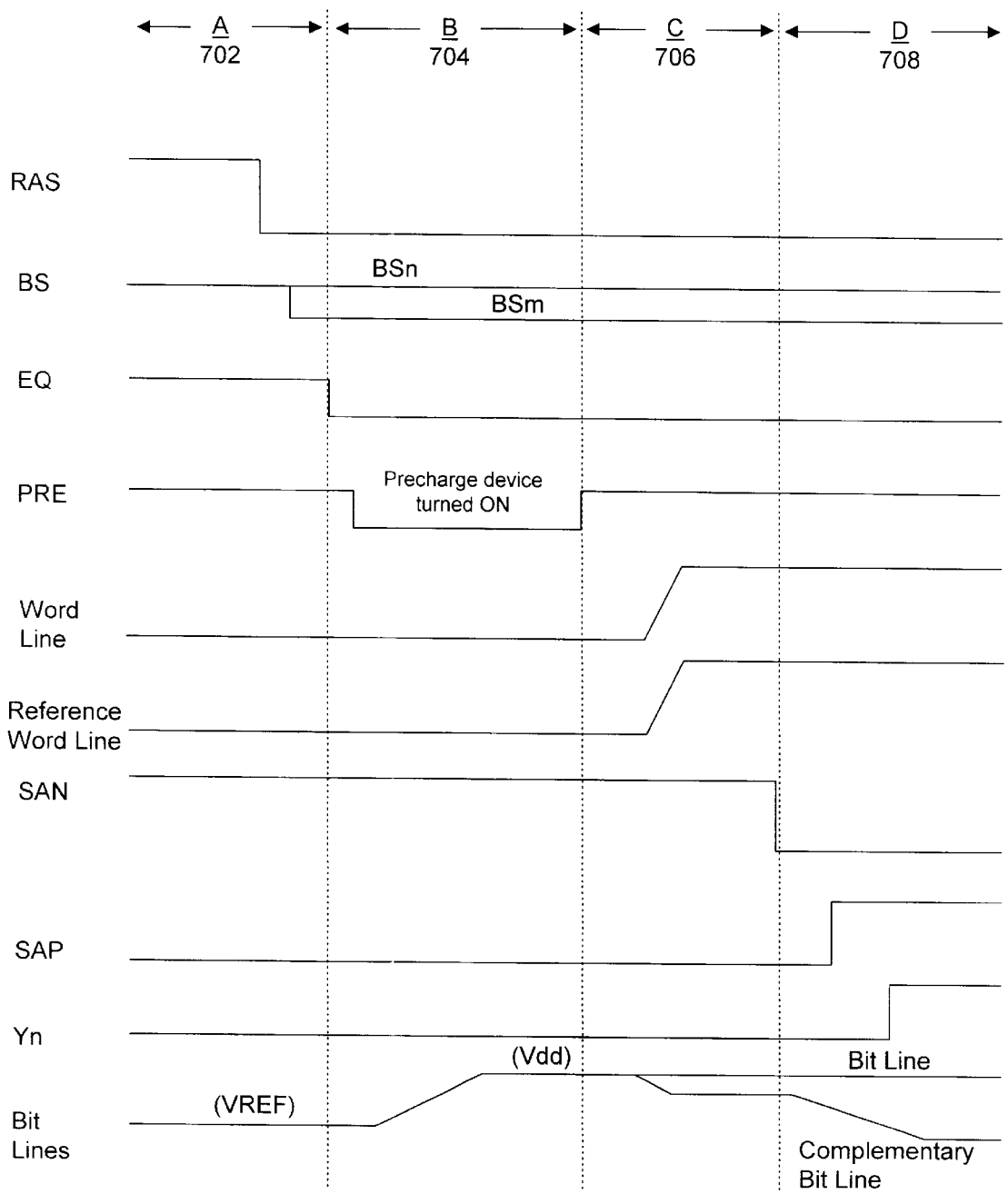

FIG. 7 illustrates the timing diagram for the sensing circuitry of FIG. 7 in accordance with the present invention.

Figure 8:
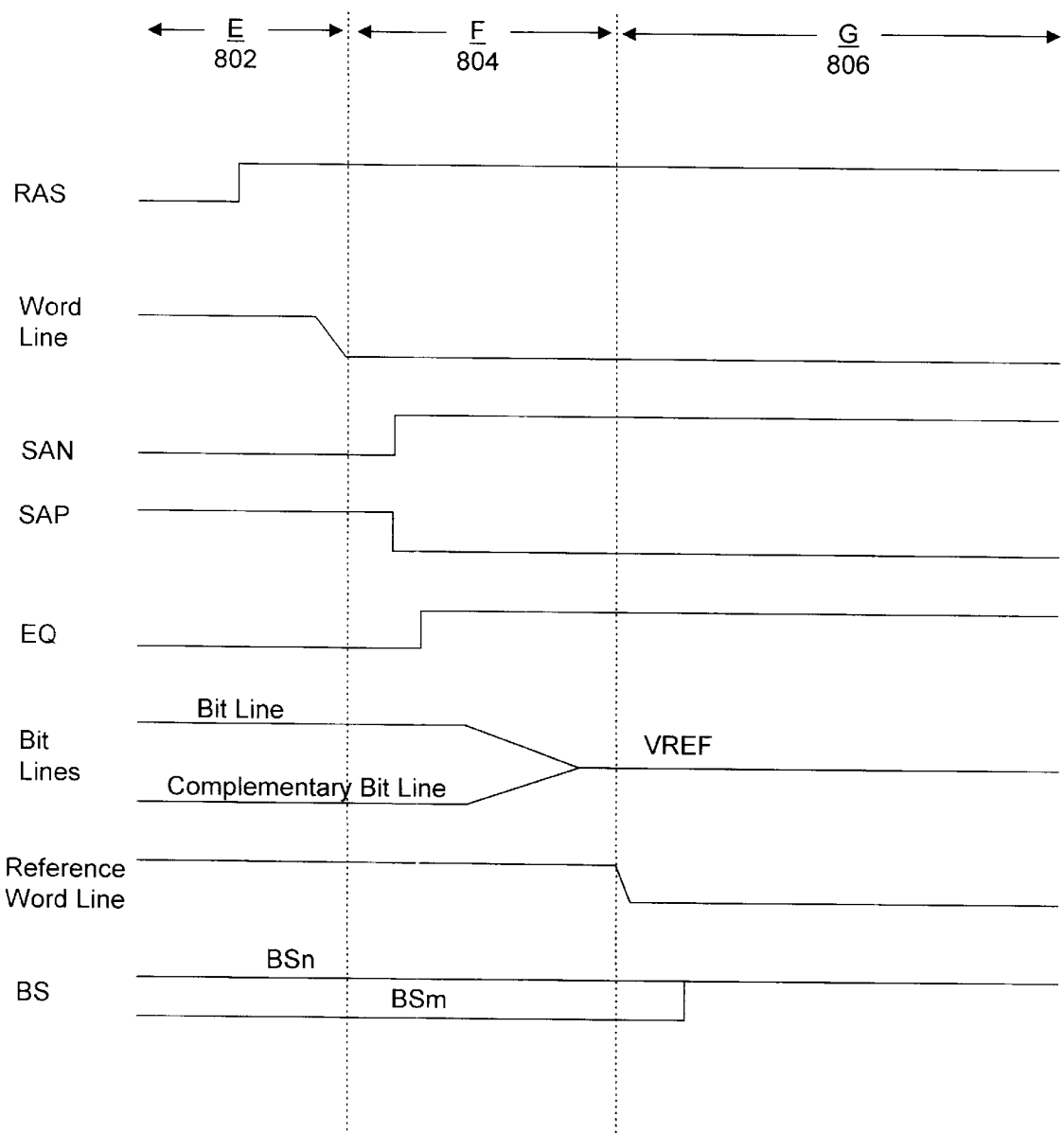

FIG. 8 illustrates the timing diagram for the restoration operation for the sensing circuitry of FIG. 6 accordance with the present invention.

Figure 9:
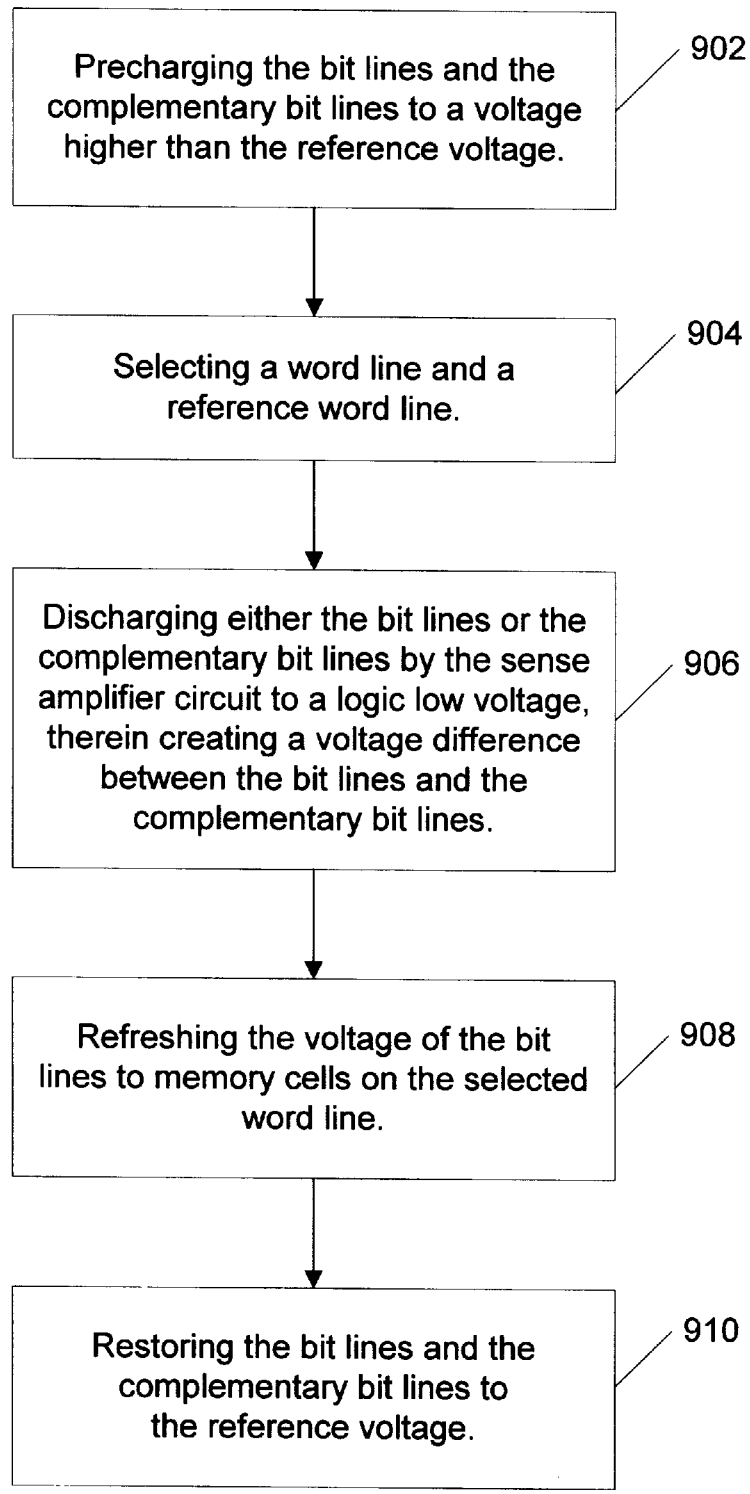

FIG. 9 is a simple flow chart for the refresh operation with a low Vdd in a memory structure in accordance with the present invention.

DETAILED DESCRIPTION OF THE INVENTION

The present invention relates to a refresh operation in a memory device where the bit lines are precharged at full Vdd, resulting in sense amplifiers which would operate reliably with a Vdd at low voltages (i.e., typically lower than 2.0 V). The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiments shown but is to be accorded the widest scope consistent with the principles and features described herein.

To more particularly describe the features of the present invention, refer to the following discussion in conjunction with the accompanying FIGS. 5 through 9.

The top view of a structure of a memory cell organization 500 that can be utilized in a method in accordance with the present invention is illustrated in FIG. 5. Each circle in the figure represents a storage capacitor in a memory cell. The memory cell arrays comprise two types of memory cells. One is the normal memory cell 502 in the normal cell array 504 and the other is the reference memory cell 506 in the reference cell array 508. Since a system and method in accordance with the present invention precharges bit lines to full Vdd, using bit lines to store reference voltage as in the conventional structure 400 of FIG. 4 is not available. Thus, the structure 500 uses reference word lines 510 to store the reference voltage.

FIG. 6 is a circuit diagram of a preferred embodiment of a sensing circuitry 600 for a periodic refresh operation in accordance with the present invention. In this embodiment, Vdd is some voltage below 2.0 V, such as 1.8 V. The threshold voltage of the N-SA's 618 transistors 632a–632b is approximately 0.9 V. Before the refresh operation occurs, the normal memory cells storing a logic high will have a charge lower than 1.8 V due to leakage. During the refresh operation in accordance with the present invention, the bit line 602 and complementary bit line 604 are precharged to full Vdd, or 1.8 V. Then a word line 636 is selected, along with its corresponding reference word line 638. Next, charge sharing occurs between the bit line 602 and the normal memory cell 640 on the selected word line 636, and between the complementary bit line 604 and the reference cell 642 on the selected reference word line 638. If a "1" is stored on the storage capacitor of the normal memory cell 640, then the resulting bit line 602 voltage will stay at approximately Vdd, or 1.8 V. The bit line 602 voltage is then applied to the gate of transistor 632b. With a bit line voltage of 1.8 V and a threshold voltage of transistor 632b at 0.9 V, the voltage difference between them is 0.9 V. This level of voltage difference is reliably detected by the transistor 632b.

If the conventional sensing structure 400 was used, where the bit lines are precharged to one-half Vdd, the bit line voltage would only be slightly above 0.9 V after charge sharing, and the voltage difference would only be 0.1 V–0.2 V. As explained in the BACKGROUND OF THE INVENTION section, the transistors associated with the N-SA may not be able to detect such a small voltage difference and thus would not be appropriately activated. Thus the method and structure in accordance with the present invention provides a much greater voltage difference than the conventional sensing structure 400, one which the sense amplifier transistors will correctly detect. This significantly increases the reliability of the sensing device. When the signal Yn 630 is high, the column select device 624 is turned on, causing the data to be transferred onto the D/B lines 626. The data is then transferred to a location external to the circuit 600. This transfer of data is not relevant to the refresh operation.

To more particularly describe the features of the preferred embodiment of the sensing circuitry 600, refer to the following discussion in conjunction with FIG. 6 and FIG. 7, the timing diagrams for the sensing structure 600. Time period A (702) is the standby cycle where all read and write operations are suspended. During this time period, the equalization device 612 is turned on, precharging all bit lines 602 and complementary bit lines 604 to one-half Vdd. This is accomplished from the output voltage (Vg) 608 from the one-half Vdd voltage generator to the common node of the NMOS transistors of the equalization device 612. (The one-half Vdd voltage generator is well known in the art and will not be discussed in detail here.) The gate signal EQ 610 of the equalization device 612 will be pulled high, charging both the bit lines 602 and the complementary bit lines 604 to one-half Vdd. During this time period, the bank signals Bsn 606 and Bsm 628 are also charged up. Then either Bsn 606 or Bsm 628 is discharged or pulled down to isolate unselected memory arrays from the sensing operation. The exact voltage for signals EQ, Bsn, and Bsm can be different from design to design.

During time period B (704), the equalization device 612 is turned off. Then the precharge device 616 is turned on, charging all bit lines 602 and complementary bit lines 604 to full Vdd, the Vdd voltage being supplied at node 614. Bit lines 602 and complementary bit lines 604 were first charged to one-half Vdd before being charged to full Vdd because if they were precharged immediately to full Vdd, then leakage current may be increased for memory cells that store data low.

During time period C (706), the precharge device 616 is turned off, and a word line 636 and its reference word line 638 are selected. Charge is shared between the bit line 602 and a normal memory cell 640 on the selected word line 636, and between the complementary bit line 604 and a reference cell 642 on the selected reference word line 638. If the charge in the normal memory cell 640 is at Vdd, the charge on the bit line 602 will remain at Vdd while the voltage on the complementary bit line 604 will drop below Vdd.

During time period D (708), after the charge sharing is complete, the N-SA 618 is activated by pulling down the SAN node 620 to ground. The voltage difference between the gate and the source of the bottom transistor 632b of N-SA 618 thus becomes larger than its threshold voltage, activating the transistor 632b and causing the complementary bit line 604 to be discharged to ground. This in turn causes the voltage difference between the gate and source of the transistor 634a of the P-SA 622 to be higher than its threshold voltage, causing the transistor 634a to activate and charge the bit line 602 to full Vdd. The voltage on the bit line 602 is then written back into the normal memory cell 640 on the selected word line 636, restoring it to fuill Vdd.

The same process occurs if a "0" is stored in a normal memory cell 640 on the selected word line 636. Before the refresh operation, the normal memory cells storing a logic low will have a charge slightly higher than ground due to leakage, as explained above. When the sense amplifiers 618 and 622 are activated, the complementary bit line 604 would be charged to full Vdd while the bit line 602 would discharge to ground. The voltage on the bit line 602 is then written back into the normal memory cell 640 on the selected word line 636, restoring it to ground.

After time period D (708) ends, the restoring of the proper reference voltage level to the bit lines 602 and complementary bit lines 604 begins. The timing diagram for this restoration is in FIG. 8. First, the word line 636 is deselected during time period E (802). The equalization device 612 is then turned on during time period F (804), which equalizes the bit line 602 and complementary bit line 604 to the reference voltage of one-half Vdd. Once they are equalized to one-half Vdd, the reference word line 638 is deselected at time period G (806) and restored to one-half Vdd. The deselection of the reference word line 638 must wait until after the bit line 602 and complementary bit line 604 have been restored to one-half Vdd. If the deselection occurs earlier, then the reference cell would not be restored to one-half Vdd properly. The bit line 602 and complementary bit line 604, as well as reference cell 642, have now been restored to their original voltages of one-half Vdd and are ready for the next refresh cycle.

The above features of the preferred embodiment of the present invention for the refresh operation with a low Vdd in a memory structure is described in the simple flow chart illustrated in FIG. 9. First, the bit lines and the complementary bit lines are precharged to a voltage higher than the reference voltage, via step 902. Second, a word line and a reference word line are selected, via step 904. Third, either the bit lines or the complementary bit lines, are discharged to ground, therein creating a voltage difference between the bit lines and the sense amplifier circuit, via step 906. Last, the voltage on the bit line is then refreshed to the memory cells on the selected word line, via step 908. The steps 902–910 are repeated for each word line in the DRAM chip. By utilizing the steps in FIG. 9, the voltage difference between a bit line voltage and the threshold voltage of the sense amplifier's transistors will be sufficiently large even for low Vdd's such that the sense amplifier will activate at the appropriate times.

Although the preferred embodiment of the present invention is described with a Vdd of 1.8 V and a reference voltage of 0.9 V, one of ordinary skill in the art will understand that other Vdd and reference voltages may be used to accomplish a refreshing of charge without departing from the spirit and scope of the present invention.

Although the preferred embodiment of the present invention is described with precharging the bit lines and complementary bit lines to one-half Vdd before precharging them to full Vdd, one of ordinary skill in the art will understand that they may be precharged directly to full Vdd without departing from the spirit and scope of the present invention.

A method and structure for a refresh operation on a low voltage of logic high in a memory device has been disclosed. This method and structure allows the use of a logic high voltage lower than 2.0 V without compromising the reliability of the sense amplifier. It does this by providing for the precharging of bit lines to full Vdd and restoring one-half Vdd to reference cells. By doing so, the voltage from the gate to the source of the transistors of the sense amplifiers will be large enough to ensure that the sense amplifiers will be activated at the appropriate times. The implementation of the method and structure of the present invention requires no new or sophisticated manufacturing processes, and thus is cost effective and practical for most if not all DRAM applications. It allows DRAMs to be operated with a lower voltage requirement. Although the present invention has been described in accordance with the embodiment shown, one of ordinary skill in the art will readily recognize that there could be variations to the embodiment and those variations would be within the spirit and scope of the present invention. Accordingly, many modifications may be made by one of ordinary skill in the art without departing from the spirit and scope of the appended claims.

What is claimed is:

1. A method for refreshing a memory structure, the memory structure including a sense amplifier circuit, a plurality of bit lines and a plurality of complementary bit lines coupled to the sense amplifier circuit, a plurality of word lines and a plurality of reference word lines coupled to the plurality of bit lines and the plurality of complementary bit lines, and the plurality of word lines each including a plurality of memory cells, the method comprising the steps of:

(a) precharging the plurality of bit lines and the plurality of complementary bit lines to a voltage higher than a reference voltage;

(b) selecting at least one of the plurality of word lines and at least one of the plurality of reference word lines;

(c) discharging the plurality of bit lines by the sense amplifier circuit to a voltage of a logic low when at least one of the plurality of memory cells residing on the at least one of the plurality of word lines and on the plurality of bit lines stores a logic low, and discharging the plurality of complementary bit lines by the sense amplifier circuit to a voltage of a logic low when the at least one memory cell stores a logic high, therein creating a voltage difference between the plurality of bit lines and the plurality of complementary bit lines;

(d) refreshing the voltage of the plurality of bit lines to the plurality of memory cells on the at least one of the plurality of word lines; and (e) restoring the plurality of bit lines and the plurality of complementary bit lines to the reference voltage.

2. The method in claim 1 wherein the precharging step (a) comprises the steps of:

(a1) precharging the plurality of bit lines and the plurality of complementary bit lines to the reference voltage which is less than the logic high voltage; and (a2) precharging the plurality of bit lines and the plurality of complementary bit lines from the reference voltage to a voltage higher than the reference voltage.

3. The method in claim 2 wherein the precharging step (a1) is performed by an equalization device.

4. The method in claim 2 wherein the precharging step (a2) is performed by a precharge device.

5. The method in claim 1 wherein the selecting step (b) further comprises the sharing of charge between at least one of a plurality of normal memory cells residing on the plurality of word lines and the plurality of bit lines and between at least one of a plurality of reference cells residing on the plurality of reference word lines and the plurality of complementary bit lines.

6. The method of claim 1 wherein the restoring step (e) comprises the steps of:

(e1) deselecting the at least one of the plurality of word lines;

(e2) activating an equalization device such that the plurality of bit lines and the plurality of complementary bit lines are equalized at the reference voltage; and (e3) deselecting the at least one of the plurality of reference word lines.

7. A system for refreshing a memory structure, the memory structure including a sense amplifier circuit, a plurality of bit lines and a plurality of complementary bit lines coupled to the sense amplifier circuit, a plurality of word lines and a plurality of reference word lines coupled to the plurality of bit lines and the plurality of complementary bit lines, and the plurality of word lines each including a plurality of memory cells, comprising:

means for precharging the plurality of bit lines and the plurality of complementary bit lines to a voltage higher than a reference voltage;

means for selecting at least one of the plurality of word lines and at least one of the plurality of reference word lines;

means for discharging the plurality of bit lines by the sense amplifier circuit to a voltage of a logic low when at least one of the plurality of memory cells residing on the at least one of the plurality of word lines and on the plurality of bit lines stores a logic low, and discharging the plurality of complementary bit lines by the sense amplifier circuit to a voltage of a logic low when the at least one memory cell stores a logic high, therein creating a voltage difference between the plurality of bit lines and the plurality of complementary bit lines;

means for refreshing the voltage of the plurality of bit lines to the plurality of memory cells on the at least one of the plurality of word lines; and means for restoring the plurality of bit lines and the plurality of complementary bit lines to the reference voltage.

8. The system in claim 7 wherein the means for precharging the plurality of bit lines and the plurality of complementary bit lines comprises:

means for precharging the plurality of bit lines and the plurality of complementary bit lines to the reference voltage which is less than the voltage of a logic high; and means for precharging the plurality of bit lines and the plurality of complementary bit lines from the reference voltage to a voltage higher than the reference voltage.

9. The system in claim 8 wherein the means for precharging the plurality of bit lines and the plurality of complementary bit lines to the reference voltage is provided by an equalization device.

10. The system in claim 8 wherein the means for precharging the plurality of bit lines and the plurality of complementary bit lines from the reference voltage to a voltage higher than the reference voltage is provided by a precharge device.

11. The system in claim 7 wherein the selecting means further comprises:

means for the sharing of charge between at least one of a plurality of normal memory cells residing on the plurality of word lines and the plurality of bit lines; and means for the sharing of charge between at least one of a plurality of reference cells and the plurality of complementary bit lines.

12. The system of claim 7 wherein the restoring means comprises:

means for deselecting the at least one of the plurality of word lines;

means for activating an equalization device such that the plurality of bit lines and the plurality of complementary bit lines are equalized at the reference voltage; and means for deselecting the at least one of the plurality of reference word lines.

13. A circuit for refreshing a memory structure, the memory structure including a plurality of bit lines and a plurality of complementary bit lines coupled to the circuit, a plurality of word lines and a plurality of reference word lines coupled to the plurality of bit lines and the plurality of complementary bit lines, and the plurality of word lines each including a plurality of memory cells, comprising:

(a) a precharge circuit which precharges the plurality of bit lines and the plurality of complementary bit lines to a voltage higher than a reference voltage;

(b) a selecting circuit which selects at least one of the plurality of word lines and at least one of the plurality of reference word lines;

(c) a sensing circuit which discharges the plurality of bit lines to a voltage of a logic low when at least one of the plurality of memory cells residing on the at least one of the plurality of word lines and on the plurality of bit lines stores a logic low, and discharges the plurality of complementary bit lines to a voltage of a logic low when the at least one memory cell stores a logic high; and (d) a refresh circuit which refreshes the voltage of the plurality of bit lines to the plurality of memory cells on the least one of the plurality of word lines.

* * * * *